US007676207B2

(12) United States Patent
Ismail et al.

(10) Patent No.: US 7,676,207 B2
(45) Date of Patent: Mar. 9, 2010

(54) SYSTEM AND METHOD FOR DIGITAL AUTONOMOUS AUTOMATIC GAIN CONTROL (AGC) FOR DVB-H RECEIVERS

(75) Inventors: Aly Ismail, Irvine, CA (US); Janakan Sivasubramaniam, Irvine, CA (US); Edward Youssoufian, Irvine, CA (US); Nabil Yousef, Foothill Ranch, CA (US); Frank Carr, New Coast, CA (US)

(73) Assignee: Newport Media, Inc., Lake Forest, CA (US)

( * ) Notice: Subject to any disclaimer, the term of this patent is extended or adjusted under 35 U.S.C. 154(b) by 860 days.

(21) Appl. No.: 11/370,761

(22) Filed: Mar. 8, 2006

(65) Prior Publication Data

US 2007/0213018 A1    Sep. 13, 2007

(51) Int. Cl.
*H04B 1/06* (2006.01)
*H04B 1/04* (2006.01)

(52) U.S. Cl. .................... 455/232.1; 455/130; 455/136; 455/138; 455/127.2

(58) Field of Classification Search .............. 455/232.1, 455/130, 136, 138, 127.2, 118, 127.3, 127.4, 455/179.1–180.3, 184.1, 188.1–190.1, 227.1, 455/230, 234.1–234.2, 240.1, 241.1, 247.1, 455/250.1, 251.1, 293, 309, 311–313, 323, 455/326, 333–334, 336–341
See application file for complete search history.

(56) References Cited

U.S. PATENT DOCUMENTS

| 5,930,696 | A  | * | 7/1999  | Tzuang et al. | ............... | 455/311 |
| 7,088,984 | B2 | * | 8/2006  | Oiwa          | ............... | 455/339 |
| 7,095,454 | B2 | * | 8/2006  | Waight et al. | ............... | 348/731 |
| 7,139,547 | B2 | * | 11/2006 | Wakayama et al. | ......... | 455/333 |
| 7,336,939 | B2 | * | 2/2008  | Gomez         | ............... | 455/307 |
| 7,346,114 | B2 | * | 3/2008  | Iancu et al.  | ............... | 375/260 |
| 7,423,699 | B2 | * | 9/2008  | Vorenkamp et al. | ......... | 348/726 |

OTHER PUBLICATIONS

Antoine et al., "A Direct-Conversion Receiver for DVB-H", IEEE Journal of Solid-State Circuits, vol. 40, No. 12 Dec. 2005.

* cited by examiner

*Primary Examiner*—Pablo N Tran
(74) *Attorney, Agent, or Firm*—Rahman LLC

(57) ABSTRACT

Digital autonomous AGC for a DVB-H receiver comprises detecting a plurality of RF signals entering a LNA in the DVB-H receiver; detecting a RF transmitter blocker signal occurring at the LNA; and differentiating between a desired RF signal and an undesired RF transmitter blocker signal by varying a differential gain of current through the LNA. A RF servo loop is used for detecting the RF transmitter blocker signal. Logic circuitry of the RF servo loop is integrated with a baseband AGC loop to step control the differential gain of current through the LNA. A RF wideband detector is used for detecting the plurality of RF signals entering the LNA; and sending a voltage output corresponding to voltage levels of the RF signals to a plurality of comparators, wherein each of the plurality of comparators are set at a different programmable voltage threshold level compared with one another.

26 Claims, 5 Drawing Sheets

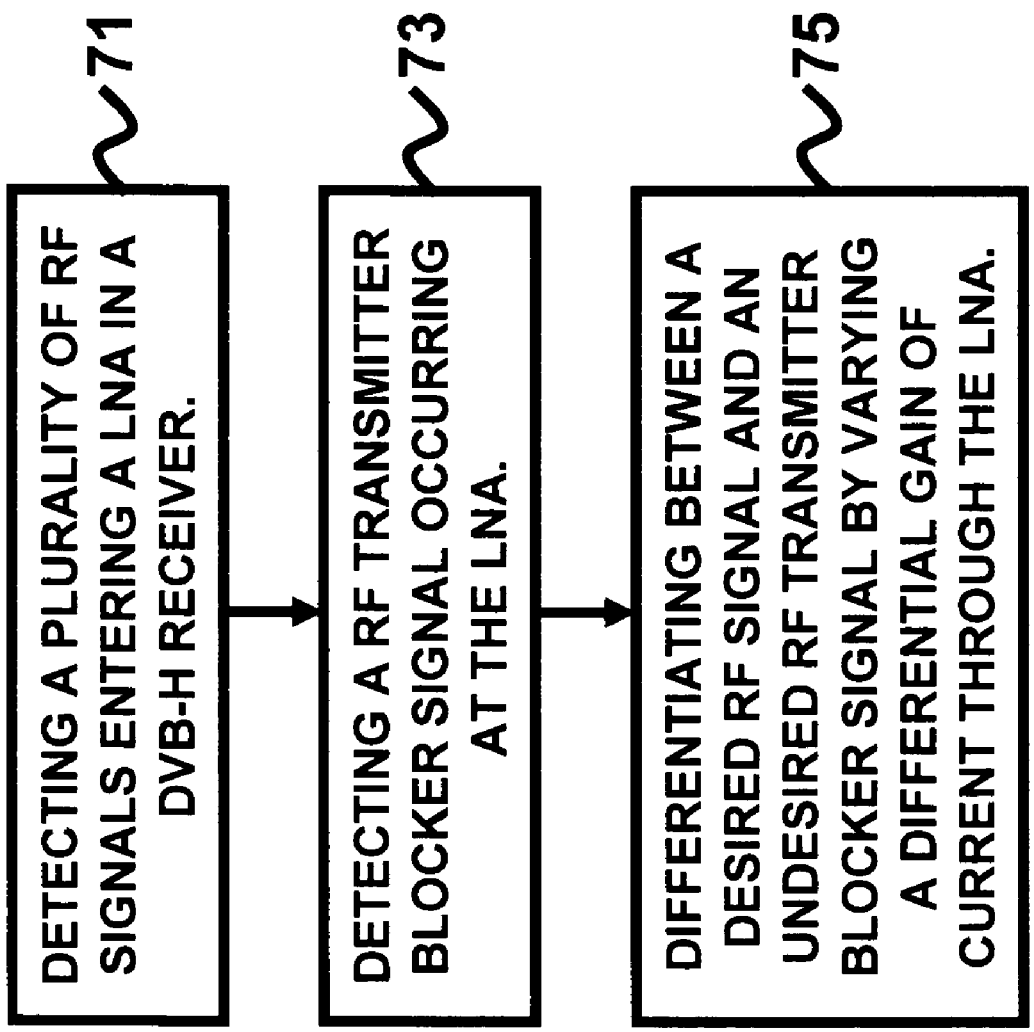

SYSTEM AND METHOD FOR DIGITAL AUTONOMOUS AUTOMATIC GAIN CONTROL (AGC) FOR DVB-H RECEIVERS

BACKGROUND

1. Technical Field

The embodiments herein generally relate to wireless technology, and, more particularly, to control systems and methods for wireless receivers.

2. Description of the Related Art

In conventional wireless receivers, the large range of signal power at the radio frequency (RF) input often mandates the variation of front-end low noise amplifier (LNA) gain along with the baseband variable gain amplifiers (VGA). Furthermore in Digital Video Broadcasting-Handheld (DVB-H) systems, a low desired signal may be suddenly jammed with a Global System for Mobile communications transmitter-blocker (GSM TX-blocker) that could easily compress the front-end. This scenario exists along with potential signal down fades that have to be tracked and corrected by the baseband automatic gain control (AGC) servo loops. Therefore, a technique is needed to quickly detect various blocker signal levels at the LNA. A technique is also needed to apply these gain steps while minimally affecting data transmission.

RFAGC loops using wideband detectors that sense the LNA signal output power are incorporated in a silicon germanium bipolar complementary metal oxide semiconductor (SiGe BICMOS) design as described in Antoine, P. et al., "A Direct Conversion Receiver for DVB-H," IEEE Journal of Solid-State Circuits, Vol. 40, No. 12, pp. 2536-2544, December 2005, the complete disclosure of which, in its entirety, is herein incorporated by reference. This detected output is then passed to a translinear circuit for dB-linear control of the RF front-end gain. A differential pair in the signal path soft switches signal current to/from the LNA output. In this implementation, the RFAGC and baseband AGC values are passed as chip outputs for the demodulator logic to decode and pass back.

Typically, the demodulator that accepts the baseband AGC and/or the RFAGC data takes a substantial amount of time (hundreds of Hz) to properly correct the tuner's baseband gain. Once the desired signal is deemed as being too large, there is a "takeover point" where the baseband AGC minimizes the baseband gain, and starts reducing the RF front end gain. This point is chosen to appear well below the front end's compression point, and not affect front-end linearity. While noise performance is degraded due to RF front end attenuation, the carrier signal is large enough so as not to affect the signal to noise ratio (SNR) adversely.

However, the soft switching core in the LNA signal path generally degrades the third-order intercept point (IP3) due to its non-linearity in the middle of the switch. This is disadvantageous because a dramatically bad IP3 anywhere along the switch characteristics generally means a poor front-end linearity performance of the tuner. This implies that interferer signals can jam or reduce the SNR of the desired signal. It also tends to leave the control lines susceptible to magnetic/capacitive coupling that could cause cross modulation terms. Generally, until now no clear solution in a CMOS stand-alone tuner exists that integrates the digital RFAGC along with logic that regulates information from the RFAGC loop as well as the baseband AGC loop.

SUMMARY

In view of the foregoing, an embodiment herein provides a method of digital autonomous AGC for a DVB-H receiver, wherein the method comprises detecting a plurality of RF signals entering a LNA in the DVB-H receiver; detecting a RF transmitter blocker signal occurring at the LNA; and differentiating between a desired RF signal and an undesired RF transmitter blocker signal by varying a differential gain of current through the LNA. The method may further comprise using a RF servo loop for detecting the RF transmitter blocker signal. Additionally, the method may further comprise integrating logic circuitry of the RF servo loop with a baseband AGC loop to step control the differential gain of current through the LNA. Moreover, the method may further comprise using a RF wideband detector for detecting the plurality of RF signals entering the LNA; and sending a voltage output corresponding to voltage levels of the RF signals to a plurality of comparators, wherein each of the plurality of comparators are set at a different programmable voltage threshold level compared with one another.

Also, the method may further comprise comparing the voltage levels of the RF signals to the voltage threshold level of each comparator. Preferably, the method further comprises stepping down the differential gain of current through the LNA when a voltage level of a particular RF signal is larger than the voltage level of one of the plurality of comparators. The method may further comprise using a plurality of differential amplifiers to vary the differential gain of current through the LNA by progressively diverting half of a remaining RF signal current away from an output of the LNA. Additionally, the method may further comprise varying the differential gain of current through the LNA by approximately 6 dB decrements. Preferably, an operational timing of the RF servo loop and the baseband AGC loop occurs during a cycle of approximately one DVB-H data burst.

Another embodiment provides a system for performing digital autonomous AGC for a DVB-H receiver, wherein the system comprises logic circuitry adapted to detect a plurality of RF signals entering a LNA in the DVB-H receiver; logic circuitry adapted to detect a RF transmitter blocker signal occurring at the LNA; and a control circuit adapted to differentiate between a desired RF signal and an undesired RF transmitter blocker signal by varying a differential gain of current through the LNA. Preferably, the logic circuitry adapted to detect the RF transmitter blocker signal occurring at the LNA comprises a RF servo loop. The system may further comprise a baseband AGC loop integrated with the RF servo loop, wherein the integration of the baseband AGC with the RF servo loop causes a step control of the differential gain of current through the LNA.

Additionally, the system further comprises a RF wideband detector adapted to detect the plurality of RF signals entering the LNA; and a plurality of comparators operatively connected to the RF wideband detector, wherein the plurality of comparators are adapted to receive a voltage output corresponding to voltage levels of the RF signals, wherein each of the plurality of comparators are set at a different programmable voltage threshold level compared with one another. Moreover, the system further comprises a multiplexer adapted to compare the voltage levels of the RF signals to the voltage threshold level of each comparator. Preferably, the system further comprises a plurality of differential amplifiers operatively connected to the LNA, wherein the differential amplifiers are adapted to step down the differential gain of current through the LNA when a voltage level of a particular RF signal is larger than the voltage level of one of the plurality of comparators, wherein the differential amplifiers are adapted to vary the differential gain of current through the LNA by progressively diverting half of a remaining RF signal current away from an output of the LNA, wherein the differential amplifiers are adapted to vary the differential gain of current through the LNA by approximately 6 dB decrements, and wherein an operational timing of the RF servo loop and the baseband AGC loop occurs during a cycle of approximately one DVB-H data burst.

Another embodiment provides a circuit for performing digital autonomous AGC for a DVB-H receiver, wherein the circuit comprises a LNA in the DVB-H receiver, wherein the LNA is adapted to receive a plurality of RF signals; a RF servo loop operatively connected to the LNA, wherein the RF servo loop is adapted to detect a RF transmitter blocker signal occurring at the LNA; and a baseband AGC loop integrated with the RF servo loop, wherein the integration of the baseband AGC with the RF servo loop creates a control circuit adapted to differentiate between a desired RF signal and an undesired RF transmitter blocker signal by varying a differential gain of current through the LNA. Preferably, the integration of the baseband AGC with the RF servo loop causes a step control of the differential gain of current through the LNA.

Additionally, the circuit further comprises a RF wideband detector adapted to detect the plurality of RF signals entering the LNA; and a plurality of comparators operatively connected to the RF wideband detector, wherein the plurality of comparators are adapted to receive a voltage output corresponding to voltage levels of the RF signals, wherein each of the plurality of comparators are set at a different programmable voltage threshold level compared with one another. The circuit may further comprise a multiplexer adapted to compare the voltage levels of the RF signals to the voltage threshold level of each comparator. Additionally, the circuit may further comprise a plurality of differential amplifiers operatively connected to the LNA, wherein the differential amplifiers are adapted to step down the differential gain of current through the LNA when a voltage level of a particular RF signal is larger than the voltage level of one of the plurality of comparators, and wherein the differential amplifiers are adapted to vary the differential gain of current through the LNA by progressively diverting half of a remaining RF signal current away from an output of the LNA, and wherein the differential amplifiers are adapted to vary the differential gain of current through the LNA by approximately 6 dB decrements. Preferably, an operational timing of the RF servo loop and the baseband AGC loop occurs during a cycle of approximately one DVB-H data burst.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 5 is a flow diagram illustrating a preferred method according to an embodiment herein.

DETAILED DESCRIPTION OF PREFERRED EMBODIMENTS

Figure 1:
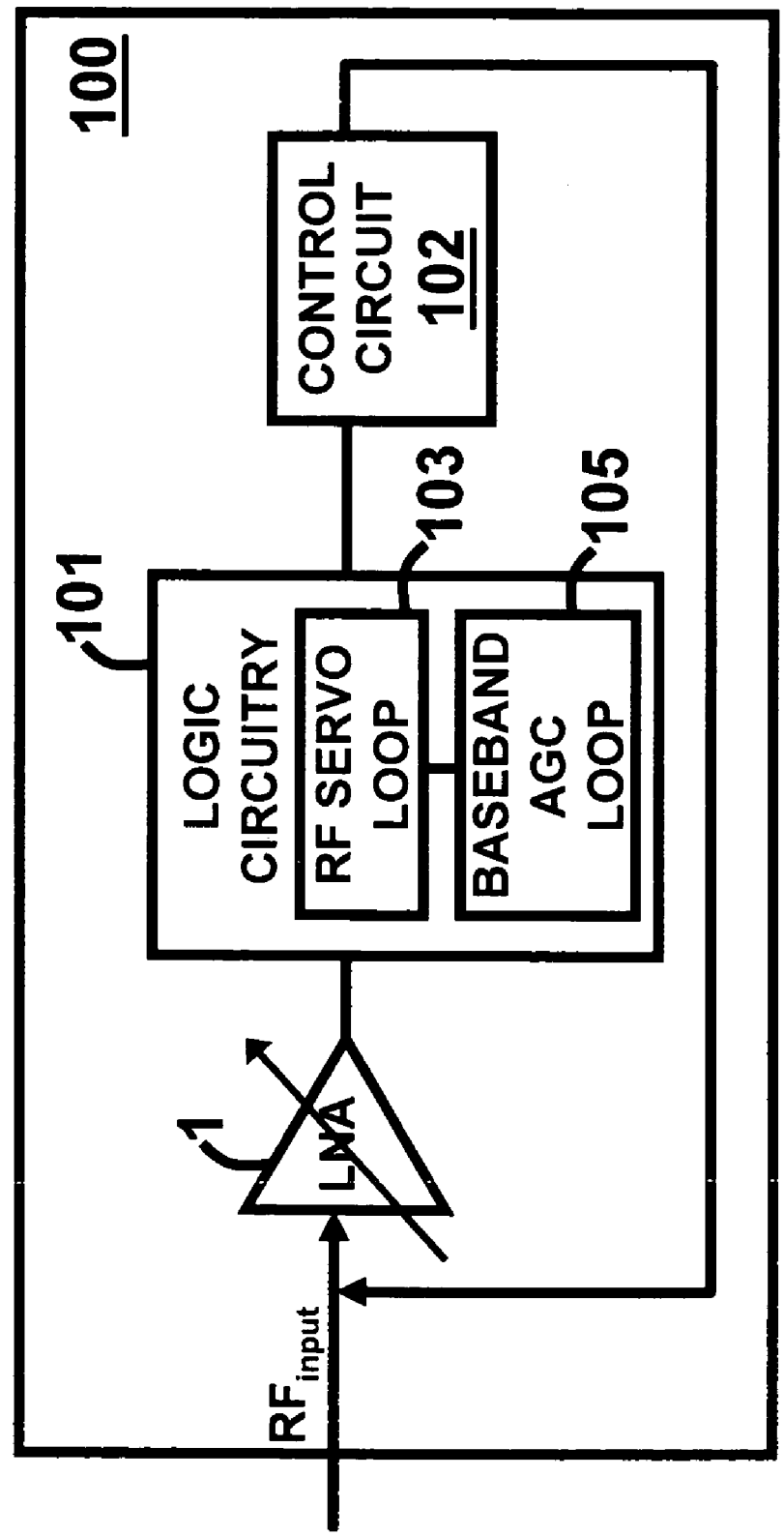
FIG. 1 illustrates a system block diagram according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a technique to quickly detect various blocker signal levels at the LNA and for a technique to apply the gain steps while minimally affecting data transmission. The embodiments herein achieve this by providing a technique of detecting the input RF blockers with a RF servo loop and integrating its logic with a baseband AGC loop to step control the front-end LNA gain. These loops can then be used to discern the desired RF signal from the undesired blockers while preventing front-end compression. In other words, this information can then be combined with baseband servo-loop data to discern between blocker and desired signals and vary the LNA gain in a timely and power-conscious manner. Referring now to the drawings, and more particularly to FIGS. 1 through 5, where similar reference characters denote corresponding features consistently throughout the figures, there are shown preferred embodiments.

Figure 2:
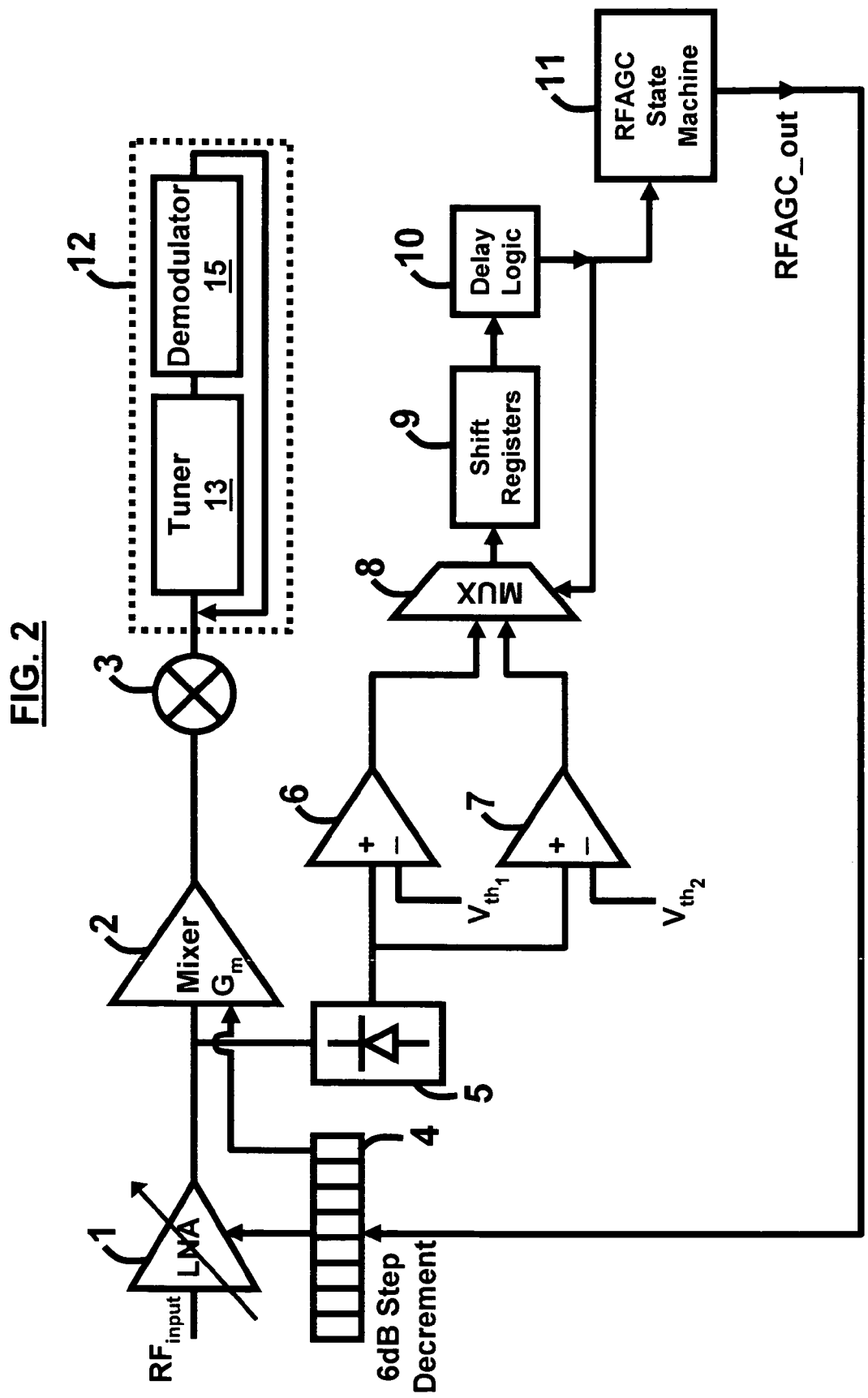
FIG. 2 illustrates a block diagram of a LNA gain step RF signal path according to an embodiment herein.
Figure 3:
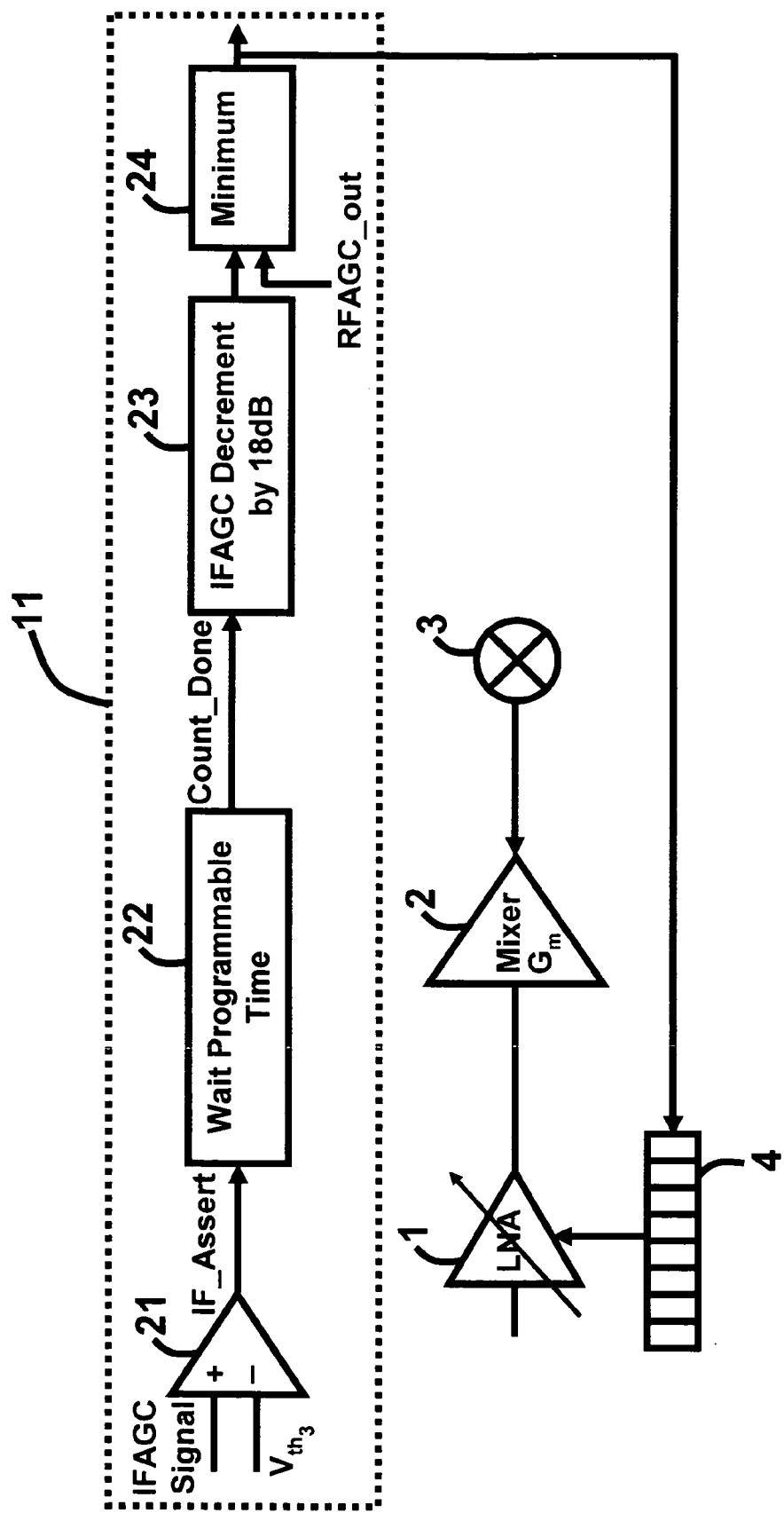
FIG. 3 illustrates a block diagram of a LNA gain step intermediate frequency (IF) signal path according to an embodiment herein.

With reference to FIGS. 1 through 3, the embodiments herein provide a system 50 for performing digital autonomous AGC for a DVB-H receiver 100, wherein the system 50 comprises logic circuitry 101 adapted to detect a plurality of RF signals entering a LNA 1 in the DVB-H receiver 100; logic circuitry 101 adapted to detect a RF transmitter blocker signal occurring at the LNA 1; and a control circuit 102 adapted to differentiate between a desired RF signal and an undesired RF transmitter blocker signal by varying a differential gain of current through the LNA 1. Preferably, the logic circuitry 101 adapted to detect the RF transmitter blocker signal occurring at the LNA 1 comprises a RF servo loop 103.

The system 50 may further comprise a baseband AGC loop 105 integrated with the RF servo loop 103, wherein the integration of the baseband AGC loop 105 with the RF servo loop 103 causes a step control of the differential gain of current through the LNA 1. Additionally, the system 50 further comprises a RF wideband detector 5 adapted to detect the plurality of RF signals entering the LNA 1; and a plurality of comparators 6, 7 operatively connected to the RF wideband detector 5, wherein the plurality of comparators 6, 7 are adapted to receive a voltage output corresponding to voltage levels of the RF signals, wherein each of the plurality of comparators 6, 7 are set at a different programmable voltage threshold level, $Vth_1$, $Vth_2$, compared with one another.

Moreover, the system 50 further comprises a multiplexer (mux) 8 adapted to compare the voltage levels of the RF signals to the voltage threshold level of each comparator 6, 7. Preferably, the system further comprises a plurality of differential amplifiers 40 operatively connected to the LNA 1, wherein the differential amplifiers 40 are adapted to step down 4 the differential gain of current through the LNA 1 when a voltage level of a particular RF signal is larger than the voltage level of one of the plurality of comparators 6 or 7, wherein the differential amplifiers 40 are adapted to vary the differential gain of current through the LNA 1 by progressively diverting half of a remaining RF signal current away from an output of the LNA 1, wherein the differential amplifiers 40 are adapted to vary the differential gain of current through the LNA 1 by approximately 6 dB decrements, and wherein an operational timing of the RF servo loop 103 and the baseband AGC loop 105 occurs during a cycle of approximately one DVB-H data burst.

The path of the RF loop 103 is shown in FIG. 2 (with reference to the elements of FIG. 1). The RF signal is detected at the output of the LNA 1 before the mixer 3 and transconductor 2 (Mixer-Gm) stage with an RF wideband detector 5 that sends its voltage output to two comparators 6, 7. Each comparator 6, 7 is set at different programmable threshold levels. The first comparator 6 is used to boost current in the Mixer-Gm 2 and improve linearity, while the second comparator 7 asserts approximately 6 dB higher. When the comparator 7 asserts, it switches on more current through the Mixer-Gm stage 2 which lowers its output impedance. By doing so, this implies that a larger swing can be presented at the Mixer-Gm stage 2 output without distortion. Both comparators 6, 7 receive the same RF power detector output voltage to one of their inputs. Threshold $Vth_1$ is connected to the other input of comparator 6, while threshold $Vth_2$ is connected to other input of comparator 7. Preferably, the level of $Vth_2$ is set higher than $Vth_1$ such that an extra 6 dB signal strength is needed to make comparator 7 trigger or assert.

The mux 8 following the comparators 6, 7 looks at comparator 6 first. This is accomplished by default. After the first 6 dB attenuation step, the mux 8 looks at comparator 7. The digital output is sent to a logic block which triggers a shift register 9 into action. The shift register 9 is used to delay action to check if the blocker that is triggering the comparator 6 is valid. The interferer signal that is being searched for is the GSM blocker which is assumed to be present for at least a brief period of time. Sudden increases/decreases in signal strength will not seriously degrade performance so these increases/decreases may be ignored by determining whether the blocker signal is present for a reasonable period of time. This is accomplished by collecting samples in the shift register 9 and only triggering the comparator 6 if all the shift register outputs are equal to 1.

The delay logic 10 is programmable to potentially accommodate different interferers. Once the blocker is deemed valid, a logic signal from the delay logic 10 is sent back to the mux 8 to look at comparator 7. If the RF signal is larger than the threshold of comparator 7, the subsequent action is to step down 4 the LNA gain in 6 dB steps. This RF feedback loop 103 quickly settles given that the main time constant is the shift register delay. The delay in the shift register 9 is approximately hundreds of microseconds after which a 6 dB attenuation step is taken. Given that a maximum of six of these attenuation steps exist, the total time for the front end gain to settle is approximately one half of a millisecond. In conjunction, the baseband AGC loop 105 between the tuner 13 and demodulator 15 is also considered in the LNA gain stepping.

The RFAGC state machine 11 serves as the baseband AGC loop 105 as depicted in FIG. 3 and further discussed below.

Accordingly, the embodiments herein provide an RF loop 103 and a baseband AGC loop 105. Both loops 103, 105 regulate the L-NA output to step down its gain as needed (the former in 6 dB steps and the latter in 18 dB steps). The logic circuitry 101 and control circuit 102 basically take the worst case attenuation between the two loops 103, 105 and uses that on the LNA 1.

As mentioned, the path of the baseband AGC loop 105 is further illustrated in FIG. 3. Once the baseband AGC of the tuner 13 has reached its minimum gain-setting 24, it can tell the LNA 1 to gain step down 23 in multiples of 18 dB, so that the desired signal (not the blocker signal) does not compress the front-end. The method by which the LNA 1 is gain stepped down is described below. The greatest loop path gain correction between the baseband loop 105 and the RF loop 103 is considered when correcting the LNA 1. As per FIG. 2, after the mixer 3, the signal passes through a baseband section 12. The outputs then go to another demodulator logic chip (not shown) which, after processing, sends a voltage signal back to the tuner chip 13. In FIG. 3, elements 21 and 22 receive this input voltage, $Vth_3$, and hold the value for a predetermined period of time to ensure that it is really telling the tuner 13 to drop its baseband gain.

Figure 4:
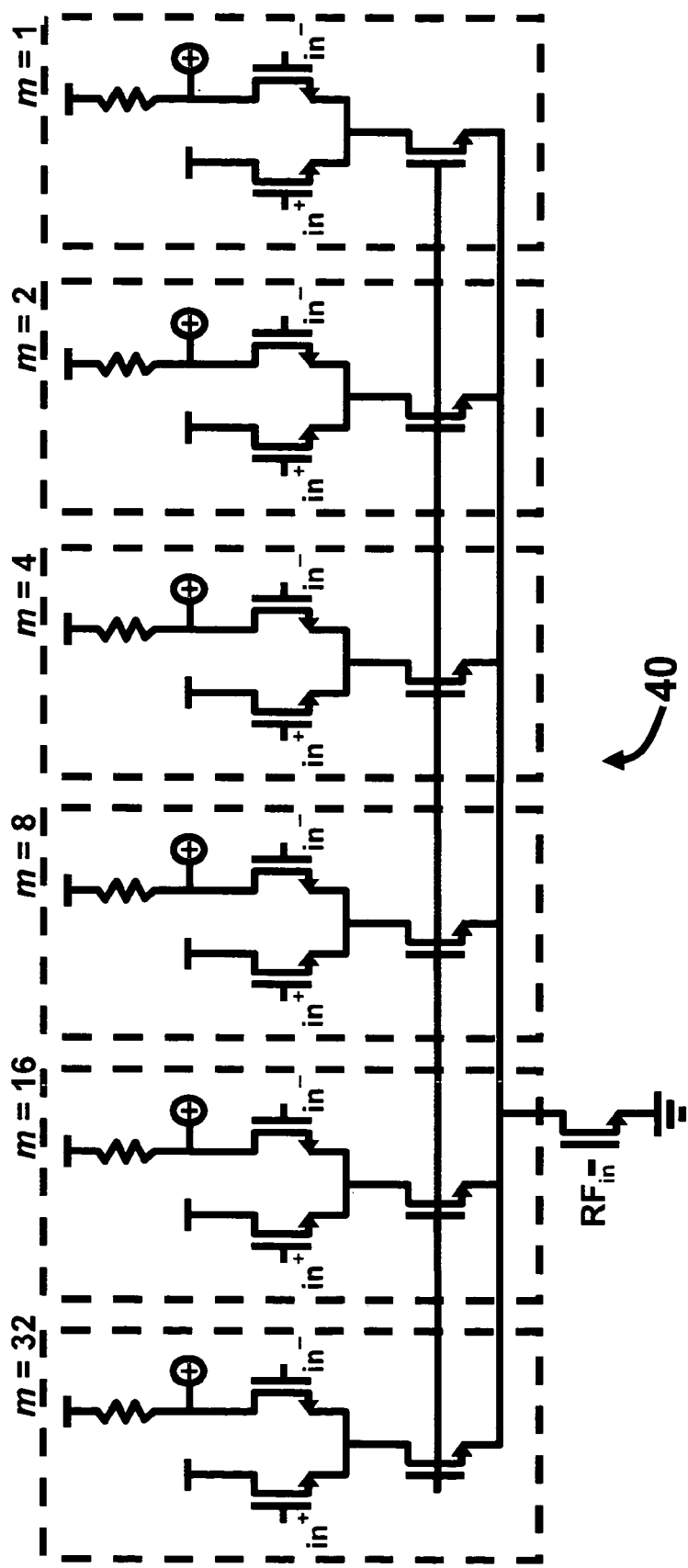
FIG. 4 illustrates a circuit diagram illustrating digital gain stepping in a LNA according to an embodiment herein.

With reference to FIG. 4, preferably, the digital LNA gain steps 4 (of FIGS. 2 and 3) are implemented by a series of hard switched differential pairs of amplifiers 40 in series with the signal path that progressively diverts half of the remaining signal current away from the output. As shown in FIG. 4, thirty-two differential amplifiers are first switched to divert half of the signal current away from the output. Subsequently, sixteen differential amplifiers are switched, and then eight differential amplifiers, and so on. This results in attenuating steps of 6 dB with better linearity and noise performance compared with conventional systems' soft switching techniques.

From a timing perspective, the entire loop works during one DVB-H data burst, and the RF loop 103 can quickly assimilate blocker information just before the start of data burst and after calibration. This reduces the possibility of signal corruption during transmission. The logic decisions from the RFAGC loop can be held for a programmable number of data burst cycles depending on demodulator 15 and system demands.

FIG. 5, with reference to FIGS. 1 through 4, is a flow diagram illustrating a method of digital autonomous AGC for a DVB-H receiver 100, wherein the method comprises detecting (71) a plurality of RF signals entering a LNA 1 in the DVB-H receiver 100; detecting (73) a RF transmitter blocker signal occurring at the LNA 1; and differentiating (75) between a desired RF signal and an undesired RF transmitter blocker signal by varying a differential gain of current through the LNA 1.

The method may further comprise using a RF servo loop 103 for detecting the RF transmitter blocker signal. Additionally, the method may further comprise integrating logic circuitry of the RF servo loop 103 with a baseband AGC loop 105 to step control the differential gain of current through the LNA 1. Moreover, the method may further comprise using a RF wideband detector 5 for detecting the plurality of RF signals entering the LNA 1; and sending a voltage output corresponding to voltage levels of the RF signals to a plurality of comparators 6, 7, wherein each of the plurality of comparators 6, 7 are set at a different programmable voltage threshold level compared with one another.

Also, the method may further comprise comparing the voltage levels of the RF signals to the voltage threshold level of each comparator 6, 7. Preferably, the method further comprises stepping down the differential gain of current through the LNA 1 when a voltage level of a particular RF signal is larger than the voltage level of one of the plurality of comparators 6, 7. The method may further comprise using a plurality of differential amplifiers 40 to vary the differential gain of current through the LNA 1 by progressively diverting half of a remaining RF signal current away from an output of the LNA 1. Additionally, the method may further comprise varying the differential gain of current through the LNA 1 by approximately 6 dB decrements. Preferably, an operational timing of the RF servo loop 103 and the baseband AGC loop 105 occurs during a cycle of approximately one DVB-H data burst.

The techniques provided by the embodiments herein can be applied to any time sliced transmission system, and the detector and logic loops can be constructed in different technologies than CMOS such BICMOS, SiGe, bipolar and gallium arsenide (GaAs) technologies. Additionally, more complicated logic functions can be implemented to better control process variations in the loop components also. Furthermore, the embodiments herein can be used in the design/implementation of any receiver (for example, wireless, TV tuner, modems) and can be used to achieve low current highly linear CMOS downconverting mixers for RF receivers.

The techniques provided by the embodiments herein may be implemented in an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Generally, in the conventional techniques, a RF power detector is used to detect the LNA output to estimate signal strength. This information is then used to gradually turn down or "soft switch" the LNA gain. Conversely, the embodiments herein provide a RF power detector 5 and use digital logic 101 to "hard switch" the LNA gain down. One of the differences between the embodiments herein and the conventional techniques exists in the hard switching as well as the logic methodology to accomplish the hard switching.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims

What is claimed is:

1. A method of digital autonomous automatic gain control (AGC) for a Digital Video Broadcasting-Handheld (DVB-H) receiver, said method comprising:
    detecting a plurality of radio frequency (RF) signals entering a low noise amplifier (LNA) in said DVB-H receiver;
    detecting a RF transmitter blocker signal occurring at said LNA; and
    differentiating between a desired RF signal and an undesired RF transmitter blocker signal by varying a differential gain of current through said LNA.

2. The method of claim 1, further comprising using a RF servo loop for detecting said RF transmitter blocker signal.

3. The method of claim 2, further comprising integrating logic circuitry of said RF servo loop with a baseband AGC loop to step control said differential gain of current through said LNA.

4. The method of claim 1, further comprising:
    using a RF wideband detector for detecting said plurality of RF signals entering the LNA; and
    sending a voltage output corresponding to voltage levels of said RF signals to a plurality of comparators,
    wherein each of said plurality of comparators are set at a different programmable voltage threshold level compared with one another.

5. The method of claim 4, further comprising comparing said voltage levels of said RF signals to said voltage threshold level of each comparator.

6. The method of claim 5, further comprising stepping down said differential gain of current through said LNA when a voltage level of a particular RF signal is larger than said voltage level of one of said plurality of comparators.

7. The method of claim 1, further comprising using a plurality of differential amplifiers to vary said differential gain of current through said LNA by progressively diverting half of a remaining RF signal current away from an output of said LNA.

8. The method of claim 1, further comprising varying said differential gain of current through said LNA by approximately 6 dB decrements.

9. The method of claim 3, wherein an operational timing of said RF servo loop and said baseband AGC loop occurs during a cycle of approximately one DVB-H data burst.

10. A system for performing digital autonomous automatic gain control (AGC) for a Digital Video Broadcasting-Handheld (DVB-H) receiver, said system comprising:
    logic circuitry adapted to detect a plurality of radio frequency (RF) signals entering a low noise amplifier (LNA) in said DVB-H receiver;

logic circuitry adapted to detect a RF transmitter blocker signal occurring at said LNA; and a control circuit adapted to differentiate between a desired RF signal and an undesired RF transmitter blocker signal by varying a differential gain of current through said LNA.

11. The system of claim 10, wherein said logic circuitry that detects said RF transmitter blocker signal occurring at said LNA comprises a RF servo loop.

12. The system of claim 11, further comprising a baseband AGC loop integrated with said RF servo loop, wherein the integration of said baseband AGC with said RF servo loop causes a step control of said differential gain of current through said LNA.

13. The system of claim 10, further comprising:
a RF wideband detector adapted to detect said plurality of RF signals entering the LNA; and
a plurality of comparators operatively connected to said RF wideband detector, wherein said plurality of comparators are adapted to receive a voltage output corresponding to voltage levels of said RF signals,
wherein each of said plurality of comparators are set at a different programmable voltage threshold level compared with one another.

14. The system of claim 13, further comprising a multiplexer that compares said voltage levels of said RF signals to said voltage threshold level of each comparator.

15. The system of claim 14, further comprising a plurality of differential amplifiers operatively connected to said LNA, wherein said differential amplifiers step down said differential gain of current through said LNA when a voltage level of a particular RF signal is larger than said voltage level of one of said plurality of comparators.

16. The system of claim 10, further comprising a plurality of differential amplifiers operatively connected to said LNA, wherein said differential amplifiers vary said differential gain of current through said LNA by progressively diverting half of a remaining RF signal current away from an output of said LNA.

17. The system of claim 10, further comprising a plurality of differential amplifiers operatively connected to said LNA, wherein said differential amplifiers vary said differential gain of current through said LNA by approximately 6 dB decrements.

18. The system of claim 12, wherein an operational timing of said RF servo loop and said baseband AGC loop occurs during a cycle of approximately one DVB-H data burst.

19. A circuit for performing digital autonomous automatic gain control (AGC) for a Digital Video Broadcasting-Handheld (DVB-H) receiver, said circuit comprising:

a low noise amplifier (LNA) in said DVB-H receiver, wherein said LNA receive a plurality of radio frequency (RF) signals;

a RF servo loop operatively connected to said LNA, wherein said RF servo loop detects a RF transmitter blocker signal occurring at said LNA; and a baseband AGC loop integrated with said RF servo loop, wherein the integration of said baseband AGC with said RF servo loop creates a control circuit that differentiate between a desired RF signal and an undesired RF transmitter blocker signal by varying a differential gain of current through said LNA.

20. The circuit of claim 19, wherein said integration of said baseband AGC with said RF servo loop causes a step control of said differential gain of current through said LNA.

21. The circuit of claim 19, further comprising:
a RF wideband detector adapted to detect said plurality of RF signals entering the LNA; and
a plurality of comparators operatively connected to said RF wideband detector, wherein said plurality of comparators are adapted to receive a voltage output corresponding to voltage levels of said RF signals,
wherein each of said plurality of comparators are set at a different programmable voltage threshold level compared with one another.

22. The circuit of claim 21, further comprising a multiplexer that compares said voltage levels of said RF signals to said voltage threshold level of each comparator.

23. The circuit of claim 22, further comprising a plurality of differential amplifiers operatively connected to said LNA, wherein said differential amplifiers step down said differential gain of current through said LNA when a voltage level of a particular RF signal is larger than said voltage level of one of said plurality of comparators.

24. The circuit of claim 19, further comprising a plurality of differential amplifiers operatively connected to said LNA, wherein said differential amplifiers vary said differential gain of current through said LNA by progressively diverting half of a remaining RF signal current away from an output of said LNA.

25. The circuit of claim 19, further comprising a plurality of differential amplifiers operatively connected to said LNA, wherein said differential amplifiers vary said differential gain of current through said LNA by approximately 6 dB decrements.

26. The circuit of claim 19, wherein an operational timing of said RF servo loop and said baseband AGC loop occurs during a cycle of approximately one DVB-H data burst.

* * * * *